United States Patent

Norman et al.

[11] Patent Number: 5,870,410
[45] Date of Patent: Feb. 9, 1999

[54] DIAGNOSTIC INTERFACE SYSTEM FOR PROGRAMMABLE LOGIC SYSTEM DEVELOPMENT

[75] Inventors: Kevin A. Norman, Belmont; Rakesh H. Patel, Cupertino; Stephen P. Sample, Saratoga, all of Calif.; Michael R. Butts, Beaverton, Oreg.

[73] Assignees: Altera Corporation, San Jose; Quickturn Design Systems, Inc., Mountain View, both of Calif.

[21] Appl. No.: 840,357

[22] Filed: Apr. 28, 1997

Related U.S. Application Data

[60] Provisional application No. 60/016,683 Apr. 29, 1996.
[51] Int. Cl.⁶ .................................................. G01R 31/28
[52] U.S. Cl. ........................................ 371/22.2; 371/22.32
[58] Field of Search ........................... 371/22.2, 22.31, 371/22.32, 22.35, 22.5, 25.1, 27.7, 40.11, 22.1, 27.5, 27.6; 395/847, 182.07, 183.01, 183.06, 183.18, 183.19, 182.01; 364/550, 490, 580; 365/201

[56] References Cited

U.S. PATENT DOCUMENTS

| | | | |
|---|---|---|---|
| 5,301,156 | 4/1994 | Talley | 365/201 |
| 5,412,260 | 5/1995 | Tsui et al. | 326/39 |
| 5,475,695 | 12/1995 | Caywood et al. | 371/27 |
| 5,488,688 | 1/1996 | Gonzales et al. | 395/183.1 |
| 5,574,894 | 11/1996 | Iles et al. | 395/555 |
| 5,687,325 | 11/1997 | Chang | 395/284 |
| 5,689,195 | 11/1997 | Cliff et al. | 326/41 |
| 5,694,399 | 12/1997 | Jacobson et al. | 371/22.3 |
| 5,717,695 | 2/1998 | Manela et al. | 371/21.1 |
| 5,732,407 | 3/1998 | Mason et al. | 711/104 |

*Primary Examiner*—Robert W. Beausoliel, Jr.
*Assistant Examiner*—Nadeem Iqbal

[57] ABSTRACT

An diagnostic interface system for a programmable logic system is disclosed. The diagnostic interface system provides an efficient and flexible mechanism for accessing internal nodes of programmable logic devices (PLDs) to facilitate debugging and troubleshooting of the programmable logic system. The interface system includes a diagnostic data bus connecting external I/O pins to various diagnostic data and address registers that connect to the internal circuitry of a PLD. A diagnostics controller controls the various diagnostic resources in response to user supplied control data.

13 Claims, 1 Drawing Sheet

DIAGNOSTIC INTERFACE SYSTEM FOR PROGRAMMABLE LOGIC SYSTEM DEVELOPMENT

This application claims the benefit of U.S. Provisional No. 60/016683, filed Apr. 29, 1996.

BACKGROUND OF THE INVENTION

The present invention relates in general to a system using programmable logic devices (PLDs), and in particular to a highly flexible interface system to perform full diagnostic functions for a PLD or a system using multiple PLDs.

Programmable logic has made vast inroads into the field of electronic systems design. Combining multiple PLDs into a single programmable system has made possible emulation systems having significant logic density. Ever increasing amounts of "glue" logic as well as substantial functional blocks are being drawn inside of the new high capacity PLDs. As the level of integration of this functionality increases, the performance and cost improve dramatically. With many logic signals now entirely contained inside of programmable logic devices, the speed, power, efficiency and reliability of the system also improve. The most significant issues in system reliability typically have to do with mechanical connections between devices and the printed circuit board and the connector systems between boards. Thus, as the number of logic signals which are mechanically routed on printed circuit boards and through connectors is reduced, the overall system reliability improves.

The downside of increasing integration is that less and less signals are directly accessible (i.e., observable and controllable) by the engineer charged with system debug. Many of the signals which are of considerable interest when debugging the system are often typically buried inside the programmable logic device. As a result, system debugging and troubleshooting capability is thus severely limited.

It is therefore desirable to make accessible internal nodes of programmable logic devices to improve the diagnostics capability of programmable logic systems.

SUMMARY OF THE INVENTION

The present invention provides a highly flexible interface mechanism to perform full diagnostic functions for a programmable logic system. The diagnostic interface system of the present invention includes a dedicated wide data bus, registers and a state machine to control the diagnostic circuitry. The interface system enables the user to not only observe but to control the state of internal nodes, as well as to inject faults for fault grading of test vectors. The interface system also makes the signals on all the signal pins of each programmable logic device (PLD) chip in the system, which are already physically available, more conveniently available to perform system debug efficiently.

Accordingly, in one embodiment, the present invention provides a diagnostic interface for a programmable logic system including a diagnostic data bus coupled to a plurality of diagnostic data input/output (I/O) terminals, a diagnostic data register coupled to the diagnostic data bus and to internal nodes of programmable logic circuit, and a diagnostic interface controller having a first plurality of terminals coupled to a control bus and second plurality of terminals to a corresponding plurality of control (I/O) terminals. The diagnostic interface further includes address registers coupled to the diagnostic data bus and the control bus, and to the programmable logic circuit.

In an embodiment where a programmable logic device includes a plurality of user memory blocks, the diagnostic interface of the present invention couples the memory blocks to the diagnostic data bus and further includes a memory address register coupled to the control bus and the diagnostic data bus.

A better understanding of the nature and advantages of the diagnostic interface for a programmable logic system of the present invention may be had with reference to the drawings and the detailed description below.

DESCRIPTION OF THE PREFERRED EMBODIMENT

Figure 1:
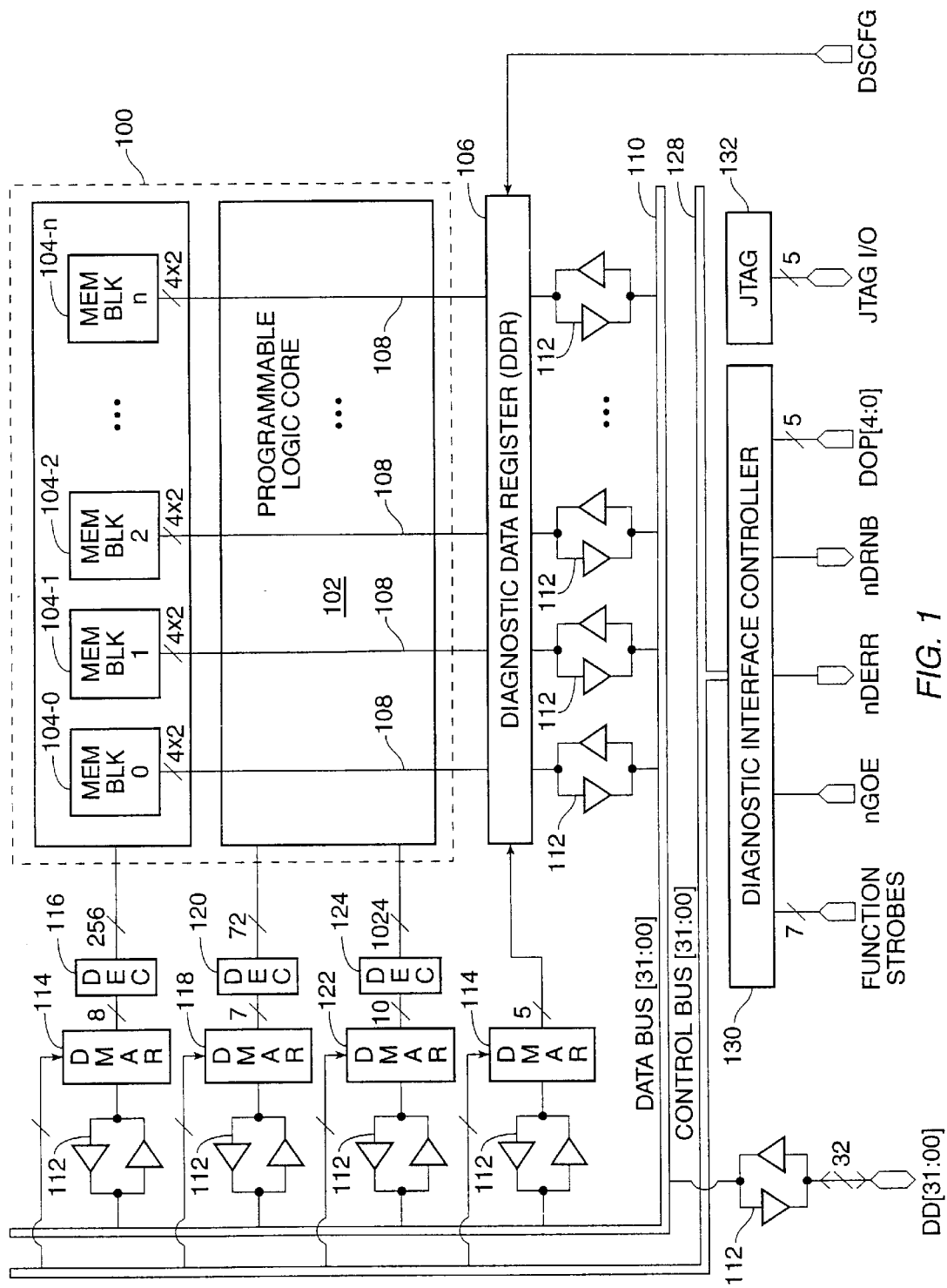
FIG. 1 is a block diagram of the diagnostic interface for a programmable logic system according to the present invention.

The PLD diagnostic interface system of the present invention preferably operates in conjunction with a programmable logic device having internal resources that provide the capability of observing and controlling the state of internal nodes within the PLD. Such a PLD's internal resources may include, for example, shadow storage units (e.g., latches) for internal nodes that hold data, such as logic elements, memory cells and I/O registers. A sample and load data path may also be provided which includes bidirectional data buses and shift registers coupled to the shadow storage units. Control signals would be used to facilitate the sampling of internal nodes for observing their logic states, and loading of internal nodes for controlling their logic state. One example of such a PLD is described in greater detail in U.S. patent application Ser. No. 08/615,342, filed Mar. 11, 1996, entitled "Sample and Load Scheme for Observability of Internal Nodes in a PLD," assigned to Altera Corporation, and hereby incorporated by reference for all purposes.

The observation and control of the state of the internal nodes of such a PLD are controlled and synchronized by master signals "sample" and "load." These synchronizing signals may be viewed as having system wide scope. That is, the same signals may control several PLD chips in a programmable system. The "sample" signal allows the user to essentially take a snapshot of the complete state of the system. This snapshot capability combined with a means of setting the logic state of individual bits inside each PLD in the system provides for a comprehensive checkpoint and restart mechanism.

In certain applications, the ability to continuously monitor the state of specific signals without sampling (i.e., higher bandwidth) is critical. By appropriate netlisting, the PLD provides the option of directly coupling certain internal nodes to the diagnostic data I/O pins that can then be continuously monitored by the user.

In the context of system integration and debug, a rapid, sure footed reconfiguration of blocks of logic (i.e., partial reconfiguration) inside a PLD confers an additional advantage when taken in combination with the means to observe and restart. One advantage is that the system is well suited to fault grading of test vectors. For example, a simple logic network fault may be injected into an otherwise pristine network by a random access "update" to partially reconfiguration a PLD. This is followed by loading a known initial state into the system, and then the system is allowed to run for some amount of time. Some time later the state of the system is sampled and examined for evidence of the error resulting from the injected fault. The same means used for partial reconfiguration may be used for a complete reconfiguration of the PLD. For high bandwidth, the system provides for a parallel configuration interface. The performance advantages of such a hardware based solution over software based solutions to fault injection is considerable. These advantages are described along with a preferred embodiment for a high performance reconfigurable system in greater detail in U.S. patent application Ser. No. 08/615,341, filed Mar. 11, 1996, entitled "Partially Reconfigurable Programmable Logic Device," assigned to Altera Corporation, and hereby incorporated by reference for all purposes.

The present invention is directed to an interface between the user and the PLD system to enable the user to perform the above-described functions of internal logic state observability and controllability, as well as partial reconfiguration. The interface of the present invention along with the circuitry and techniques described in the above-referenced patent applications provide a complete system for efficient and highly flexible diagnostic mechanism for programmable logic systems.

Referring to FIG. 1, there is shown an interface system according to an embodiment of the present invention. The interface is shown around a simplified block diagram of a PLD 100 that includes a core of programmable logic 102 with programmable interconnects, and an array of user memory blocks 104-0 to 104-n. For illustrative purposes, assume programmable interconnect and logic core 102 includes, for example, approximately one half million configuration bits (not shown) arrayed in 512 rows by 1024 columns. Programmable core 102 further includes logic elements and their respective shadow storage units (not shown) as described in the above-reference U.S. patent application Ser. No. 08/615,342. Similarly, memory cells within each block of memory 104 connect to shadow storage units (not shown). Memory blocks 104 may be of static random access memory (SRAM) type which are typically embedded in a PLD to perform the various configuration chores. Those familiar with the art of programmable logic are aware of PLDs with embedded SRAMs such as the FLEX family of high performance PLDs manufactured by Altera Corporation. The exemplary embodiment shown includes eight one kilobit (256×46) memory blocks 104 with four-port SRAM cells.

The interface system around the PLD 100 includes a diagnostic data register (DDR) 106. With programmable core 102 having, for example, 512 rows and 1024 columns, DDR 106 is designed to include thirty-two 32-bit wide words (i.e., 1024 bits). It is to be understood that the sizes of the registers, buses and numbers of bits used herein are for illustrative purposes only, and that the interface system of the present invention is not limited to the sizes specified. DDR 106 connects to programmable core 102 and memory blocks 104 through 1024 bi-directional data lines 108. In one embodiment, data lines 108 may be a complimentary pair of lines. A 32-bit wide data bus 110 connects to DDR 106 through bidirectional buffers 112. Data can be serially supplied to DDR 106 through a serial input pin DSCFG. Data bus 110 connects to 32 external diagnostic data pins DD[31:00] via 32 bi-directional buses 112. When not in a diagnostic mode of operation, the present invention allows pins DD[31:1] to be used as regular I/O pins.

The interface system further includes several registers that supply the address information for the various storage nodes of the PLD. A diagnostic memory address register (DMAR) 114 is an 8-bit wide address counter that supplies memory address to a decoder 116 the outputs of which select memory cells inside memory blocks 104. A diagnostic logic element address register (DLAR) 118 connects to a decoder 120 whose outputs select logic elements inside programmable core 102. A diagnostic row address register (DRAR) connects to a decoder 124 that selects a row of configuration bits inside programmable logic and interconnect core 102. A diagnostic column address register (DCAR) 126 connects to DDR 106 and selects one of the thirty-two 32-bit wide words of data. a diagnostic interface controller (DIC) 130 connects to a control bus 128 that drives the various resources (e.g., register) in the interface system. DIC 130 is a finite state machine that receives various control signals from, and supplies information to several external pins. The interface system further includes a JTAG block 132 that connects to external JTAG I/Os, and implements all JTAG boundary scan testing functions as defined by the IEEE standard.

The following identifies various exemplary external pins used in the interface system of the present invention as depicted in FIG. 1, with a brief statement of their function:

| Function Strobes: | | |
|---|---|---|
| nDRST: | input | Reset all shift registers, address counters and the rest of the Diagnostic Interface state machine. |
| nDIOPCLK: | input | Clock used by the I/O buffer over-current protection circuits. |
| nDS: | input | Snapshot the state of each logic element (LE) register bit, each memory array bit and each I/O pin register bit into the corresponding shadow latch. |
| nDL: | input | Forward the states in the shadow latches to the corresponding LE register bit, memory array bit and I/O pin register bit simultaneously. |
| nDIE: | input | When high, the diagnostic interface of this PLD does not respond; when low it does respond. |
| nDSTB: | input | Execution of the operation indicated by the five bit opcode DOP[4:0] is initiated by the falling edge of nDSTB. |
| nSCFGCLK: | input | Serial configuration data clock. |
| Global Tristate Signal: | | |
| nGOE: | input | Unconditionally disable all output buffers of the PLD |
| Status Outputs: | | |
| nDERR: | open drain output | Pulled low to indicate an error in the PLD including a detected output pin over-current condition or a configuration error. |
| nDRNB: | open drain output | Pulled low when the state machine in the Diagnostic Interface is still executing a previous command. When released this indicates that there is no command in progress and the interface is ready for the next command. |
| Diagnostic Data Bus: | | |
| DD[31:00] | bidirectional | Thirty-two bi-directional high speed pins for parallel input and output of diagnostic and configuration information. |
| DSCFG | input | Serial configuration data input. |
| JTAG I/Os: | | |
| TDI: | input | JTAG data input pin |
| TDO: | output | JTAG data output pin |
| TMS: | input | JTAG mode select pin |
| TCK: | input | JTAG clock |
| nTRST: | input | JTAG reset |
| Diagnostic Opcode: | | |
| DOP[4:0] | input | Five input pins decode to thirty-one operations, each of which is activated by nDSTB falling edge. See table following for opcodes. |

The following lists various exemplary operations as defined by the five-bit operation codes (opcodes):

| DOP4 | DOP3 | DOP2 | DOP1 | DOP0 | OPERATION |
|---|---|---|---|---|---|
| 0 | 0 | 0 | 0 | 0 | Normop: Normal Operation |
| 0 | 0 | 0 | 0 | 1 | Sample_MemQs: Snapshot per device all memory bit states |
| 0 | 0 | 0 | 1 | 0 | Sample_LEQs: Snapshot per device all LE flip-flop states |
| 0 | 0 | 0 | 1 | 1 | Sample_I/OQs: Snapshot per device all I/O flip-flop states |
| 0 | 0 | 1 | 0 | 0 | Sample_Qs: Snapshot per device of all LE flip-flop, I/O flip-flop and memory states |
| 0 | 0 | 1 | 0 | 1 | Sample_I/Os: Snapshot per device of I/O pin states |
| 0 | 0 | 1 | 1 | 0 | Observe_mem: Shift out the captured memory bit states |
| 0 | 0 | 1 | 1 | 1 | Observe_LEs: Shift out the captured LE flip-flop states |
| 0 | 1 | 0 | 0 | 0 | Observe_I/Os: shift out the captured I/O flip-flop or pin states |
| 0 | 1 | 0 | 0 | 1 | Observe_LAB_outputs: Allow the 32 LAB pin outputs to bypass the DDIOR and go straight to DD[31:0] |
| 0 | 1 | 0 | 1 | 0 | Fault Injection: Load bitstream of data and appropriate address |
| 0 | 1 | 0 | 1 | 1 | Clear I/O Protection fault (CLRIOPF) |
| 0 | 1 | 1 | 0 | 0 | Load_mem: Load per device all memory bit states |
| 0 | 1 | 1 | 0 | 1 | Load_Les: Load per device all LE flip-flop states |
| 0 | 1 | 1 | 1 | 0 | Load_I/Os: Load per device all I/O flip-flop states |
| 0 | 1 | 1 | 1 | 1 | Set-up for parallel configuration (MAPP) |
| 1 | 0 | 0 | 0 | 0 | Clear/Preset |
| 1 | 0 | 0 | 0 | 1 | Reserved |
| ... | ... | ... | ... | ... | Reserved |
| 1 | 1 | 1 | 1 | 1 | Null |

Observing and Controlling State Variables

In addition to configuration bits, there are a relatively large number of state variables (typically the outputs of logic element registers inside programmable logic core and the contents of memory blocks) which are of primary importance to the system integrator. There may be over, for example, ten thousand state variables. In this exemplary embodiment, there are two types of state variables: the first group of state variables (approximately two thousand) are associated with the registers (or flip-flops) inside the logic elements, and the second group of state variables (approximately eight thousand) are the contents of the memory blocks 104. Detailed descriptions of the logic element and an exemplary one-kilobit memory block are provided respectively in U.S. patent application Ser. Nos. 08/524,698, filed Sep. 6, 1995, entitled "Lookup Table Based Logic Element with Complete Permutability of the Inputs to the Secondary Signals," by Norman et al., and 08/895,576, filed Jul. 16, 1997, entitled "Programmable Logic Device with Multi-Port Memory," by Butts et al., both of which are commonly assigned to Altera Corporation and Quickturn Design Systems, Inc., and are hereby incorporated by reference for all purposes.

Thus, there are three types of storage nodes (or bits): configuration bits, logic element state variables, and memory bits. According to a preferred embodiment of the present invention, each of the three types of bits has it own protocol for being written to and for being observed. For the configuration bits, an exemplary protocol is as follows. For each row of, for example, 1024 bits there is an address line (outputs of decoder 124). When a row is selected by address register DRAR 122, an address line is asserted and each bit on the selected row is connected to the corresponding data line 108. When DDR 106 is enabled to drive the 1024 data column lines 108, data is written from DDR 106 into the row of accessed configuration bits.

For an observe operation, in an exemplary embodiment, all data column lines 108 are active simultaneously and precharged to a high level. DRAR 122 then selects an address line which is slowly ramped up in voltage. The states of the accessed configuration bits will discharge their associated column data lines depending on the logic state stored. For a configuration bit storing a logic zero state in the storage node which is connected to a column data line 108, the line is discharged. Those bits storing a logic one state will not discharge their corresponding data column lines. In this way the configuration may be sensed out of the configuration bits one row at a time. The sensed data is sampled into DDR 106 to be clocked out subsequently. This is a relatively low performance method of reading out the contents of the array of bits, but sufficient for verifying that any particular pattern is present on the configuration array. The normal operation of the part does not modify the state the configuration bits.

Unlike the configuration bits, the contents of memory blocks 104 are dynamically changing as the device operates. Those skilled in the art of system debug will recognize the value of obtaining the simultaneous values of all the state variables of interest over samples of state variables which, while close together in time, are not necessarily from the same clock cycle. For this reason, each four-port memory bit in each of the one kilobit memory blocks 104 has a shadow bit, as described in the above-referenced U.S. patent application Ser. No. 08/595,516. In operation, when the interface pin nDS goes low, the shadow latches behind each memory bit and behind each LE flip-flop follow the corresponding variable (i.e. the state of the user memory bit or the state of the LE or I/O flip-flop). Then at the rising edge of nDS the shadow latches hold that state. Similarly, when the interface pin nDL goes low, the states of the shadow bits are forced on the main variables, overwriting any previous values.

The diagnostic interface interacts with the shadow bits behind each state variable. Memory blocks 104 each have a four-data-bit wide diagnostic port which is in addition to the four programmable user ports described above. Through these ports (in parallel) thirty-two bits at a time of the memory array shadow bits are read out to data bus DD[31:00] 110 or written in from DD[31:00] bus 110. The memory address counter DMAR 114 is eight bits long and is clearable and loadable via control bus 128. DMAR 114 may also be automatically post incremented to read bursts of data from the memory blocks out to the external world starting at a chosen location.

For the logic element (LE) state variables, two means of observation are provided. First, a shadow bit mechanism is provided for a high performance breakpoint and observe protocol. When nDS is low, the shadow bits in each LE follow the LE flip-flop state. Then on the rising edge of nDS, the shadow bits hold. The approximately two thousand shadow registers are read out 32 bits at a time using a pair of complementary column data lines 108 per bit. In this exemplary embodiment, there are 72 logical rows of LE state variables. The row select is driven by DLAR 118 which is clearable, loadable and incrementable through control bus 128. Since the index is a counter, the LE shadow register states may be bursted out at relatively high speed. The use of a complimentary pair of column data lines 108 permits the shadow register to couple to the column lines with data and its complement as in a high performance SRAM memory. A high speed differential sense amplifier then drives the output data onto the DD[31:00] I/O pins.

Similarly, the LE shadow register bits are written by driving a complementary signal onto a column data line pair 108 directly from DD[31:0] I/O pins and via data bus 110. Once all 72 rows of LE shadow bits are loaded, a low active pulse of nDL transfers the shadow register states into the LE states.

A second means for observing the state of LE registers is provided by buffering thirty-two signals out of the top level multiplexers (not shown) onto the DD[31:00] I/O pins. A PLD architecture using such multiplexers is described in U.S. provisional patent application No. 60/014,440, filed Mar. 29, 1996, entitled "A High Performance Architecture for Programmable Logic," by Norman et al., which is commonly assigned to Altera Corporation and Quickturn Design Systems, Inc., hereby incorporated by reference for all purposes. This type of observe is a non-sampled protocol. That is, the full signal behavior of these 32 signals (which have been routed up through various logic levels to arrive at an X2 multiplexer) may be observed at the diagnostic interface pins DD[31:00] with a bandwidth limitation of no less than, for example, 50 MHz. The selection of which thirty-two signals will be observed is accomplished by routing the desired signals to the appropriate X2 crossbars using the general purpose routing pool as described in the above-referenced U.S. Provisional Patent Application.

The diagnostic interface of the present invention further facilitates detection and location of over-current conditions that may occur at one or more input/output pins. I/O buffer over-current protection circuits receive a sampling clock (nDIOPCLK) and continuously monitor the I/O pins for a mismatch in voltage levels that may give rise to over-current conditions. If such over-current condition lasts for more than, for example, two clock periods (i.e., not a transient current spike), a flag is set (nDERR). The JTAG boundary scan cells are then loaded with the information that indicates the pin error. The user is able to down load the information from the boundary scan cells and identify the exact location of the pin that has experienced the over-current condition. The operation of the I/O buffer over-current protection circuitry is described in greater detail in the commonly assigned U.S. patent application Ser. No. 08/893,249, filed Jul. 16, 1997, entitled "Input/Output Buffer with Over-Current Protections Circuit," by Sample et al., hereby incorporated by reference in its entirety for all purposes.

Partial Reconfiguration

To partially reconfigure the PLD for, for example, fault grading purposes, the row address for the limited scope change is first pre-loaded into the appropriate address register (e.g., DRAR 122). Then, all 1024 bits of DDR 106 is filled followed by a pulsing of the address row line. There are two ways of changing a small number of configuration bits (less than 1024) in programmable logic core 102. One is to observe the contents of the selected row, modify the desired bits in DDR 106 by 32-bit writes from DD[31:00] pins via data bus 110, and then write this back to the selected row. This is a read-modify-write style operation. A possibly faster method uses 32 writes of DD[31:00] from outside to establish the entire contents of DDR 106 from the combination of the original pattern source and the desired modified bits. Then the bits are written into the row. This method does away with the initial observe step.

Serial configuration of the device is accomplished by loading DDR 106 one bit at a time. For this purpose DDR 106 is viewed as a 1024 bit long shift register that receives its serial input through the DSCFG pin. Each time DDR 106 is filled, the contents are written 1024 bits wide into the next row of configuration bits inside programmable core logic 102.

In conclusion, the present invention provides a diagnostic interface mechanism for programmable logic systems. In programmable logic systems using PLDs equipped with diagnostic resources, such as shadow storage units for the various programmable internal nodes, the interface of the present invention provides an efficient and highly flexible mechanism for transfer of internally stored data as well as diagnostic control signals. The overall system facilitates debugging of the programmable logic by providing access to internal nodes within the PLDs. Provisions are also made to allow partial reconfiguration of a PLD that facilitates fault grading of test vectors. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A diagnostic interface system comprising:
    a programmable logic device having programmable logic core and memory;
    a diagnostic data register configured to store diagnostic data, coupled to said programmable logic core and memory, said diagnostic data register having a plurality of input/output terminals;
    a diagnostic bi-directional data bus coupled to said plurality of input/output terminals;
    a first plurality of external connector pins coupled to said diagnostic bi-directional data bus;
    a diagnostic column address register coupled to said diagnostic bi-directional data bus and said diagnostic data register, said diagnostic column address register configured to select bits of data inside said diagnostic data register;
    a diagnostic memory address register coupled to said memory and said diagnostic bi-directional data bus, said diagnostic memory address register configured to select memory cells inside memory;
    a diagnostic row address register coupled to said programmable logic core and said diagnostic bi-directional data bus, said diagnostic row address register configured to select a row of configuration bits inside said programmable logic core;
    a diagnostic logic address register coupled to said programmable logic core and said diagnostic bi-directional data bus, said diagnostic logic address register configured to select logic elements inside said programmable logic core; and a diagnostic interface controller coupled to said diagnostic column address register, diagnostic memory address register, diagnostic row address register, and diagnostic logic address register via a diagnostic control bus, said diagnostic interface controller receiving external control signals from a second plurality of external connector pins.

2. The diagnostic interface system of claim 1 wherein the interface system is integrated on the same chip.

3. The diagnostic interface system of claim 2 wherein said diagnostic data register couples to said programmable logic core and memory blocks through a plurality of bi-directional data lines.

4. The diagnostic interface system of claim 2 wherein said first plurality of external connector pins are selectively usable as normal I/O pins in a non-diagnostic mode of operation of said programmable logic device.

5. A diagnostic method for a programmable logic system made up of one or more programmable logic devices, comprising the steps of:

(a) loading a diagnostic column address register with column address information for selected bits of data inside a programmable logic device;

(b) loading a diagnostic memory address register with memory address information for a selected memory cell inside the programmable logic device when memory cells are to be tested;

(c) loading a diagnostic row address register with row address information for a selected row of configuration bits inside the logic core of the programmable logic device, when said configuration bits are to be tested;

(d) loading a diagnostic logic address register with logic address information for selected logic elements inside the logic core of the programmable logic device when said logic elements are to be tested;

(e) loading diagnostic data into a diagnostic data register;

(f) coupling a selected node inside said programmable logic device to a bi-directional data line by asserting an address line in response to said column address information; and (g) writing said diagnostic data from said diagnostic data register into said selected node via a bi-directional data line.

6. The diagnostic method of claim 5 wherein said step of writing said diagnostic data partially reconfigures said programmable logic device to test an operation of said programmable logic device.

7. The diagnostic method of claim 6 further comprising the steps of:

(h) operating the programmable logic system in a normal mode to process said diagnostic data for a predetermined period of time; and (i) detecting a response of said programmable logic to said diagnostic data.

8. A diagnostic method for a programmable logic system made up of one or more programmable logic devices, comprising steps of:

(a) loading a diagnostic column address register with column address information for selected bits of data inside a programmable logic device;

(b) loading a diagnostic memory address register with memory address information for a selected memory cell inside a programmable logic device, when a memory cell is to be tested;

(c) loading a diagnostic row address register with row address information for a selected row of configuration bits inside the logic core of the programmable logic device, when said configuration bits are to be tested;

(d) loading a diagnostic logic address register with logic address information for selected logic elements inside a programmable logic device, when said logic elements are to be tested;

(e) coupling a selected node inside said programmable logic device to a bi-directional data line by asserting an address line in response to said column address information;

(f) loading a logic state of said selected node from said bi-directional data line into a diagnostic data register; and (f) supplying said logic state of said selected node to external connector pins for user observation via a diagnostic bi-directional data bus.

9. The diagnostic method of claim 8 wherein said steps of loading, coupling and supplying are controlled by a diagnostic interface controller.

10. A computing system comprising:

a programmable logic device having a programmable logic core, memory, and diagnostic interface resources, said diagnostic interface resources comprising:

a diagnostic data register coupled to said programmable logic core through a plurality of bi-directional data lines;

a diagnostic bi-directional data bus coupled to said diagnostic data register and a plurality of external connector data input/output pins;

a diagnostic column address register having inputs coupled to said diagnostic bi-directional data bus, and outputs coupled to said diagnostic data register;

a diagnostic memory address register having inputs coupled to said diagnostic bi-directional data bus, and outputs coupled to memory;

a diagnostic row address register having inputs coupled to said diagnostic bi-directional data bus, and outputs coupled to said programmable logic core;

a diagnostic logic address register having inputs coupled to said diagnostic bi-directional data bus, and outputs coupled to said programmable logic core;

a diagnostic controller having a plurality of input/output terminals coupled to external connector control input/output pins; and a diagnostic control bus coupled to said diagnostic interface controller and said address register.

11. The computing system of claim 10 wherein said programmable logic device further comprises a user memory block coupled to said plurality of bidirectional data lines.

12. The computing system of claim 11 wherein said diagnostic column address register, diagnostic memory address register, diagnostic row address register, and diagnostic logic address register are coupled to respective address decoders.

13. the computing system of claim 12 wherein said diagnostic controller is coupled to said diagnostic control bus.

* * * * *